(12) United States Patent
Kwong et al.

(10) Patent No.: US 6,803,720 B2
(45) Date of Patent: Oct. 12, 2004

(54) HIGHLY STABLE AND EFFICIENT OLEDS WITH A PHOSPHORESCENT-DOPED MIXED LAYER ARCHITECTURE

(75) Inventors: Raymond C. Kwong, Plainsboro, NJ (US); Michael G. Hack, Pennington, NJ (US); Theodore Zhou, Princeton, NJ (US); Julia J. Brown, Princeton, NJ (US); Tan D. Ngo, Levittown, PA (US)

(73) Assignee: Universal Display Corporation, Ewing, NJ (US)

( * ) Notice: Subject to any disclaimer, the term of this patent is extended or adjusted under 35 U.S.C. 154(b) by 456 days.

(21) Appl. No.: 09/738,429

(22) Filed: Dec. 15, 2000

(65) Prior Publication Data

US 2002/0074935 A1 Jun. 20, 2002

(51) Int. Cl.[7] .............................................. H05B 33/00

(52) U.S. Cl. ...................................... 313/504; 313/506

(58) Field of Search .................................. 313/503–506, 313/498, 500, 502, 507, 509; 428/690–91, 212, 917; 427/66; 315/169.3

(56) References Cited

U.S. PATENT DOCUMENTS

| | | | |
|---|---|---|---|
| 5,294,870 A | 3/1994 | Tang et al. | |
| 5,703,436 A | 12/1997 | Forrest et al. | |
| 5,853,905 A | 12/1998 | So et al. | |
| 5,955,836 A | 9/1999 | Boerner et al. | |
| 6,097,147 A | 8/2000 | Baldo et al. | |
| 6,130,001 A | 10/2000 | Shi et al. | |
| 6,303,238 B1 * | 10/2001 | Thompson et al. | 212/504 |
| 6,344,283 B1 * | 2/2002 | Inoue et al. | 313/504 |
| 6,392,250 B1 | 5/2002 | Aziz et al. | |
| 6,614,175 B2 | 9/2003 | Aziz et al. | |
| 6,645,645 B1 * | 11/2003 | Adachi et al. | 428/690 |

OTHER PUBLICATIONS

Y. Kunugi, et al., "A Vapochromic LED", *J. Am. Chem. Soc.*, vol. 120, No. 3, pp. 589–590, 1998, no month.

M. A. Baldo, et al., "Highly efficient phosporescent emission from organic electroluminescent devices," Nature, Sep. 1998, vol. 395, pp. 151–154.

D.F. O'Brien, et al., "Improved energy transfer in electro-phosphorescent devices", *Applied Physics Letters*, vol. 74, No. 3, pp. 442–444, (Jan. 18, 1999).

M.A. Baldo, et al., "Very high efficiency green organic light–emitting devices based on electrophosphorescence", *Applied Physics Letters*, vol. 75, No. 1, pp. 4–6, (1999), no month.

Baldo et al., "Excitonic singlet–triplet ratio in s semiconducting organic thin film", *Physical Review B*, pp. 422–428 (Nov. 15, 1999).

C. Adachi et al., "High–efficiency organic electrophosphorescent devices with tris(2–phenylpyridine) iridium doped into electron–transporting materials", *Appl. Phys. Lett.*, vol. 77, No. 6, pp. 904–906 (Aug. 7, 2000).

Kwong et al., "Organic Light Emitting Devices Based on Phosphorescent Hosts and Dyes", 2000:11, Advanced Materials, pp. 1134–1138.

(List continued on next page.)

*Primary Examiner*—Joseph Williams
(74) *Attorney, Agent, or Firm*—Kenyon & Kenyon

(57) ABSTRACT

A highly stable and efficient organic light emitting device with a phosphorescent-doped mixed layer architecture comprises an anode layer; hole injecting layer over the anode layer; a mixed layer over the hole injecting layer, the mixed layer comprising an organic small molecule hole transporting material, an organic small molecule electron transporting material and a phosphorescent dopant; and a cathode layer over the mixed layer. An electron transporting layer may be present between the mixed layer and the cathode layer and a hole transporting layer may be present between the hole injecting layer and the mixed layer.

31 Claims, 4 Drawing Sheets

OTHER PUBLICATIONS

Kwong et al., "Efficient, Saturated Red Organic Light Emitting Devices Based on Phosphorescent Platinum (II) Porphyrins", *Chemistry of Materials*, vol. 11, No. 12, pp. 3709–3713 (Dec. 1999).

Djurovich et al., "Ir(III) Cyclometalated Complexes as Efficient Phosphorescent Emitters in Polymer Blend and Organic LEDs", *Polymer Preprints*, vol. 41, No. 1, pp. 770–771 (Mar. 2000).

Burrows et al., "Operating Lifetime of Phosphorescent Organic Light Emitting Devices", *Appl. Phys. Lett.*, vol. 76, No. 18, pp. 2493–2495, May 1, 2000.

Hosokawa et al., "Highly efficient blue electroluminescence from a distyrylarylene emitting layer with a new dopant", *Appl. Phys. Lett.*, 67(26), Dec. 25, 1995, pp. 3853–3855.

Choong, et al., "Organic light–emitting diodes with a bipolar transport layer", *Appl. Phys. Lett.*, vol. 75, No. 2, Jul. 12, 1999, p. 172–174.

Naka et al., "Organic electroluminescent devices using a mixed single layer", *Jpn. J. Appl. Phys.*, vol. 33, 1994, pp. L1772–L1774, no month.

Popovic et al., "Improving the efficiency and stability of organic light emitting devices by using mixed emitting layers", SPIE Conference on Organic Light–Emitting Materials and Devices, San Diego, California, Jul. 1998, *SPIE* vol. 3476, pp. 68–73.

Aziz et al., "Degradation Mechanism of Small Molecule–Based Organic Light–Emitting Devices", *Science*, vol. 283, Mar. 19, 1999, p. 1900–1902.

* cited by examiner

HIGHLY STABLE AND EFFICIENT OLEDS WITH A PHOSPHORESCENT-DOPED MIXED LAYER ARCHITECTURE

FIELD OF THE INVENTION

The present invention relates to electroluminescent devices, and more particularly to electroluminescent devices that utilize a phosphorescent-doped mixed layer architecture for enhanced stability and efficiency.

BACKGROUND

Organic light emitting devices (OLEDs), which make use of thin film materials that emit light when excited by electric current, are expected to become an increasingly popular form of flat panel display technology. This is because OLEDs have a wide variety of potential applications, including cell phones, personal digital assistants (PDAs), computer displays, informational displays in vehicles, television monitors, as well as light sources. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs), which currently dominate the growing $40 billion annual electronic display market. Due to their high luminous efficiencies, electrophosphorescent OLEDs are seen as having the potential to replace incandescent lamps, and perhaps even fluorescent lamps, for certain types of applications.

There are presently three predominant types of OLED construction that are contemplated for these devices: the "double heterostructure" (DH) OLED, the "single heterostructure" (SH) OLED, and the single layer polymer OLED. In the DH OLED, as shown in FIG. 1A, a substrate 10 is coated by an electrode layer 11, which is typically an anode layer. A thin (typically 100–500 Å) organic hole transporting layer (HTL) 12 is deposited on the anode 11. Deposited on the surface of the HTL 12 is a thin (typically, 50–500 Å) emission layer (EL) 13. The EL 13 provides the recombination site for electrons injected from a thin (typically 100–500 Å) electron transporting layer (ETL) 14 with holes from the HTL 12. Examples of prior art ETL, EL and HTL materials are disclosed in U.S. Pat. No. 5,294,870, the disclosure of which is incorporated herein by reference. Such heterostructures may be characterized as having a heterojunction at the HTL/ETL interface.

The device shown in FIG. 1A is completed by the deposition of metal contacts 15, 16 and an electrode layer 17, which is typically a cathode layer. Contacts 15 and 16 are typically fabricated from indium or Ti/Pt/Au. The electrode 17 is often a cathode having a dual layer structure comprising an alloy such as Mg/Ag 17' directly contacting the organic ETL 14, and an opaque, high work function metal layer 17" such as gold (Au) or silver (Ag) on the Mg/Ag. A LiF/Al cathode may also be used. When proper bias voltage is applied between the top electrode 17 and the contacts 15 and 16, light emission occurs from the emission layer 13 through, for example, the substrate 10.

The SH OLED, as shown in FIG. 1B, makes use of a multifunctional layer 12 that serves as both EL and HTL or a multifunctional layer 13' that serves as both EL and ETL. One requirement of the device of FIG. 1B is that the multifunctional layer 12 or 13' must have a good hole or electron transport capability, respectively. Otherwise, a separate EL layer should be included as shown for the device of FIG. 1A.

Though single and double heterostructures may include one or more polymeric layers, such heterostructures are typically comprised only of thin films of what are commonly referred to as organic small molecule materials. Such organic small molecule materials may be distinguished from polymeric materials simply as being non-polymeric materials.

In contrast to the heterostructures that are typically comprised of two or more thin films only of the small molecule materials, electroluminescent polymer films may typically be incorporated in an OLED having a single organic layer. A single layer polymer OLED is shown in FIG. 1C. As shown, this device includes a substrate 1 coated by an anode layer 3. A thin organic layer 5 of spin-coated polymer, for example, is formed over the anode layer 3, and provides all of the functions of the HTL, ETL, and EL layers of the previously described devices. A metal electrode layer 6 is formed over organic layer 5. The metal is typically Mg or other conventionally-used low work function metals.

Light emission from OLEDs is typically via fluorescence or phosphorescence. As used herein, the term "phosphorescence" refers to emission from a triplet excited state of an organic molecule. Successful utilization of phosphorescence holds enormous promise for organic electroluminescent devices. For example, an advantage of phosphorescence is that all excitons (formed by the recombination of holes and electrons in an EL), which are formed either as a singlet or triplet excited states, may participate in luminescence. This is because the lowest singlet excited state of an organic molecule is typically at a slightly higher energy than the lowest triplet excited state. This means that, for typical phosphorescent organometallic compounds, the lowest singlet excited state may rapidly decay to the lowest triplet excited state from which the phosphorescence is produced. In contrast, only a small percentage (about 25%) of excitons in fluorescent devices are capable of producing the fluorescent luminescence that is obtained from a singlet excited state. The remaining excitons in a fluorescent device, which are produced in the lowest triplet excited state of an organic molecule, are typically not capable of being converted into the energetically unfavorable higher singlet excited states from which the fluorescence is produced. This energy, thus, becomes lost to radiationless decay processes that only tend to heat-up the device.

As a consequence, since the discovery that phosphorescent materials can be used as the emissive material in highly efficient OLEDs, there is now much interest in finding still more efficient electrophosphorescent materials and OLED structures containing such materials.

SUMMARY OF THE INVENTION

The present invention includes light emitting devices with a phosphorescent-doped mixed layer architecture. These light emitting devices comprise a substrate, an anode layer; a hole injecting layer over the anode layer; a mixed layer over the hole injecting layer, the mixed layer comprising a hole transporting material and an electron transporting material and being doped with a phosphorescent material; and a cathode layer over the phosphorescent-doped mixed layer.

The mixed layer utilized in the devices of the present invention serves as the emission layer, wherein the hole transporting material and the electron transporting material in the mixed layer act as the host material for the phosphorescent dopant. This mixed layer serves to substantially reduce the accumulation of charge that is normally present at the heterojunction interface of heterostructure devices, thereby reducing organic material decomposition and enhancing device stability and efficiency. Such OLEDs having the mixed layer of the present invention may to a certain extent be thought of as "single-layer" devices, that is, to the extent that they may not have the more strongly charged heterojunction interface that is typical of a heterostructure device.

Although most holes recombine with electrons within the emissive layer, there is a possibility that excess holes may migrate to the cathode and become neutralized. This may sometimes be referred to as hole quenching. So as to prevent or reduce this neutralization or quenching of holes, an additional electron transporting layer may be provided between the mixed layer and the cathode. The electron transporting layer serves to block migration of excess holes to the cathode, thereby keeping the holes within the mixed layer to enhance device stability and efficiency. It also serves as an exciton blocking layer to confine the excitons in the emissive layer.

So as to reduce loss of excitons in the opposite direction, that is, into the hole injecting layer, a hole transporting layer may be present between the mixed layer and the hole injecting layer.

An advantage of the present invention is that it provides exceptionally stable organic light emitting devices with high device efficiency.

As used herein, the following phrases and terms have the following meanings:

"$Alq_3$" refers to tris-(8-hydroxyquinoline) aluminum.

"Anode" refers to a positively charged electrode for injecting holes into an OLED.

"BTPIr" refers to bis(2-(2'-benzo[4,5-a]thienyl) pyridinato-N,$C^{3'}$)iridium(III)acetylacetonate.

"Cathode" refers to a negatively charged electrode that injects electrons into an OLED.

"CBP" refers to 4,4'-N,N'-carbazole biphenyl.

"CuPc" refers to copper phthalocyanine.

"EL" refers to, "emission layer," which is a layer in which holes and electrons recombine to produce excitons, which may emit light, or which may transfer their energy to a dopant molecule which emits light, when a proper bias voltage is applied across the device.

"electron transporting material" refers to a charge carrying material for which charge transport is predominantly electron transport.

"ETL" refers to an "electron transporting layer," which is a layer comprising an electron transporting material as the only type of charge carrying host material.

"heterojunction devices" refer to typical single heterostructure or double heterostructure OLEDs in which an HTL/ETL interface is present.

"HIL" refers to "hole injecting layer," which comprises a hole injecting material to enhance the hole injection efficiency of the anode.

"hole transporting material" refers to a charge carrying material for which charge transport is predominantly hole transport.

"HTL" refers to a "hole transporting layer," which is a layer comprising a hole transporting material as the only type of charge carrying host material.

"mixed layer" refers to a layer that comprises a hole transporting material and an electron transporting material.

"NPD" refers to N,N'-diphenyl-N,N'-bis-alpha-napthylbenzidine.

"PtOEP" refers to 2,3,7,8,12,13,17,18-octaethyl-21H, 23H-porphine platinum II.

DETAILED DESCRIPTION

Figure 1A:
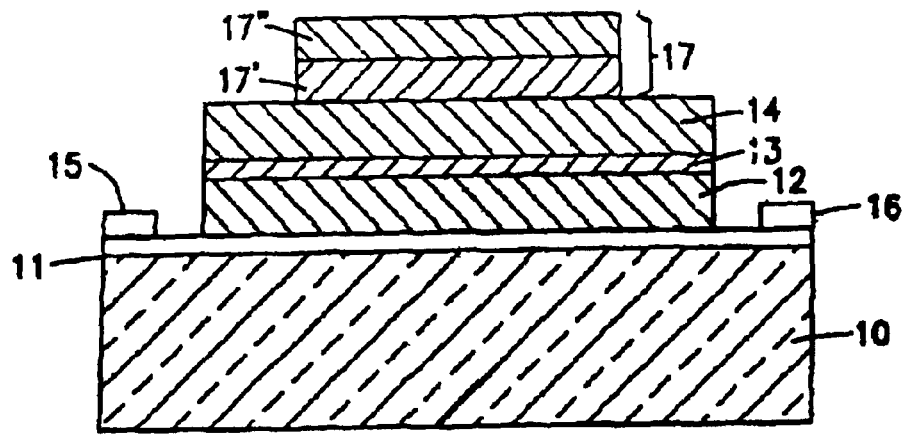
FIG. 1A is a cross sectional view of a typical organic double heterostructure light emitting device according to the prior art.
Figure 1B:
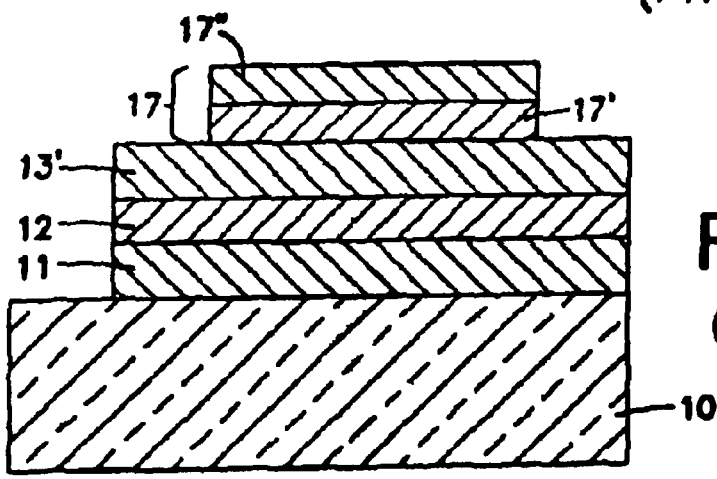
FIG. 1B is a cross sectional view of a typical organic single heterostructure light emitting device according to the prior art.
Figure 1C:
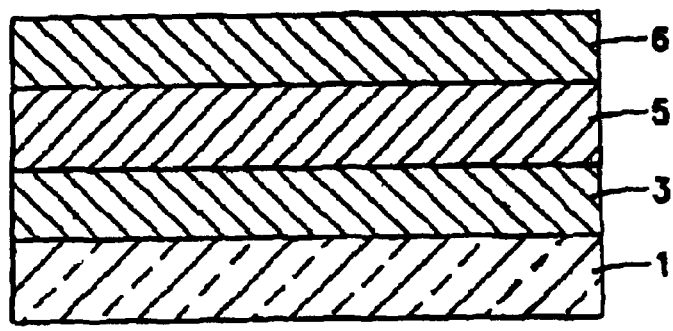
FIG. 1C is a cross sectional view of a typical single layer polymer OLED structure according to the prior art.

The present invention includes light emitting devices with a phosphorescent-doped mixed layer architecture. These light emitting devices with a phosphorescent-doped mixed layer architecture comprise a substantially transparent anode; a hole injecting layer over the anode; a mixed layer over the hole injecting layer, the mixed layer comprising an organic small molecule hole transporting material and an organic small molecule electron transporting material and being doped with a phosphorescent material; and a cathode over the phosphorescent-doped mixed layer. The phosphorescent-doped mixed layer architecture employed in the devices of the present invention provides for exceptionally stable devices with high device efficiency.

The mixed layer used in the devices of the present invention enhances both the device stability and the efficiency. The mixed layer is also the emissive layer, comprising an organic small molecule hole transporting material and an organic small molecule electron transporting material as the host materials for the phosphorescent dopant. Unlike heterojunction devices employing a separate HTL and ETL that form an HTL/ETL interface, the mixed layer of the present invention contains no HTL/ETL interfaces therein. Thus, the accumulation of charge that is typically present at such HTL/ETL interfaces, which can lead to organic material decompositions that are detrimental to device performance, is substantially reduced by the mixed layer architecture according to the present invention.

This reduction of charge accumulation may, for example, be achieved in two ways. Firstly, the mixed layer architecture may provide for a continuous composition of organic small molecule electron transporting material between the mixed layer and an adjacent electron transporting layer that is between the mixed layer and the cathode. Electrons can migrate into the mixed layer wherein the recombination with holes occurs, and thus the accumulation of electrons at the mixed layer/ETL interface is substantially eliminated. Secondly, the mixed layer architecture can result in a reduced hole mobility in the mixed layer as compared to a pure HTL which is present in a heterojunction device. This reduced hole mobility in the mixed layer leads to producing a lower concentration of holes at the mixed layer/ETL interface, and thus the hole accumulation at the mixed layer/ETL interface is substantially reduced as compared to a regular heterojunction HTL/ETL interface.

The ETL of the phosphorescent-doped mixed layer architecture of the present invention that may be present between the mixed layer and the cathode may also enhance device performance by functioning as an exciton and/or hole blocking layer. Migration of charge carriers too close to the electrodes of an OLED significantly reduces the efficiency of the OLED, and hole mobilities in organic hole transporting materials are usually higher than the electron mobilities in organic electron transporting materials. Therefore, in an OLED, it is important to inhibit holes from migrating all the way to the cathode. In the mixed layer architecture of the present invention, the ETL positioned between the mixed layer and the cathode inhibits holes from migrating to the cathode, and therefore leads to improved device efficiency.

In addition, the ETL may also function as an exciton blocking layer. A material that is used as an exciton blocking layer in an OLED may be defined as a material that has an exciton energy, defined as the energy difference between the electron and hole in a ground state exciton, that is greater than the energy of the excitons that are produced in the emissive layer of the OLED. Because of the coulomb forces between the nearby electron and hole in a ground state exciton, the exciton energy of an organic material is typically slightly less than the energy difference between the lowest unoccupied molecular orbital (LUMO) and the highest occupied molecular orbital (HOMO) of the material. Such an exciton energy substantially prevents the diffusion of excitons through the blocking layer, yet has only a minimal effect on the turn-on voltage of a completed electroluminescent device.

Thus, in the representative embodiments of the present invention that include an ETL between the mixed layer and the cathode, the electron transporting material in the ETL may also function as an exciton blocking material.

In still another embodiment of the present invention, an HTL may be present between the hole injecting layer and the phosphorescent-doped mixed layer. In this embodiment, the HTL comprises a hole transporting material that may also function as an exciton blocking material.

The present invention has been demonstrated in the representative embodiments of the present invention as having an ETL between the phosphorescent-doped mixed layer and the cathode and/or an HTL between the hole injecting layer and the phosphorescent-doped mixed layer. Such embodiments are disclosed herein to have unexpectedly improved performance characteristics, for example, with respect to external quantum efficiency and/or luminance, as compared with devices that do not have these ETL and/or HTL layers.

However, it is to be understood that the full scope of the present invention includes OLEDs having phosphorescent-doped mixed layers that may not have an ETL between the phosphorescent-doped mixed layer and the cathode, or an HTL between the phosphorescent-doped mixed layer and the hole injecting layer.

In addition, it is to be understood that the full scope of the present invention includes OLEDs having phosphorescent-doped mixed layers in which the OLED is fabricated with an inverted sequence of layers, that is, a substrate, a cathode layer, the phosphorescent-doped mixed layer, a hole injecting layer, and an anode layer. Such inverted structures may also include an ETL layer between the cathode and the mixed layer and/or an HTL between the hole injecting layer and the anode.

Figure 2:
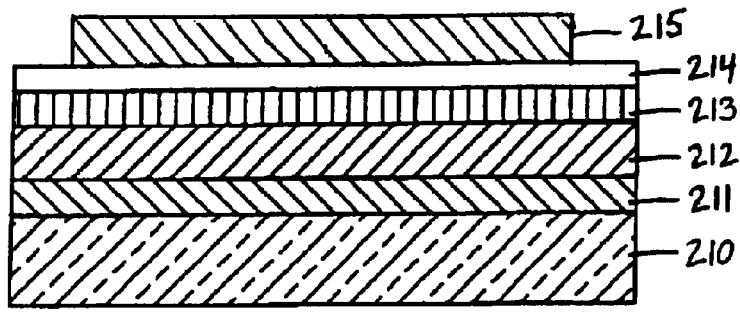
FIG. 2 is a cross sectional view of an embodiment of the present invention.

An embodiment of the present invention is shown in FIG. 2. The device 200 includes a substrate 210, an anode 211, a hole injecting layer 212, a phosphorescent-doped mixed layer 213, an electron transporting layer 214, and a cathode 215. The phosphorescent-doped mixed layer 213 functions as the emission layer. Light emission from the phosphorescent-doped mixed layer 213 occurs when a voltage is applied between the cathode 215 and the anode 211. The materials used in the device 200 include any suitable materials which fulfill the function(s) of the respective layer(s). For example, the organic small molecule hole transporting material and the organic small molecule electron transporting material in the phosphorescent-doped mixed layer may be selected, in combination with the optional ETL and/or HTL, so as to balance hole and electron injection as well as hole and electron transport through the device. The specific materials listed below are provided for illustrative purposes only.

The device 200 is manufactured upon a substrate 210. The substrate 210 may be fabricated from a transparent or opaque material, such as glass, quartz, sapphire or plastic. The substrate 210 is, for example, rigid, flexible, conformable, and/or shaped to a desired configuration.

For transparent OLEDs or top-emitting OLEDs, a transparent cathode such as disclosed in U.S. Pat. No. 5,703,436, or co-pending U.S. patent applications Ser. Nos. 08/964,863 and 09/054,707, may be used. A transparent cathode has light transmission characteristics such that the OLED has an optical transmission of at least about 50%. Preferably, the transparent cathode has light transmission characteristics that permit the OLED to have an optical transmission of at least about 70%, more preferably, at least about 85%.

A top-emitting device is one which has an opaque and/or reflective substrate such that light is produced only out of the top of the device and not through the substrate. The substrate is typically referred to as being at the bottom of the device.

Deposited upon substrate 210 is the anode 211. The anode 211 comprises an electrically conductive material having a high work function, for example, such as indium tin oxide (ITO), if a bottom-emitting or transparent device is desired, such as in a head-up application. For top-emitting devices that use an opaque or reflective anode, a high-work-function metal such as Au may be used.

Deposited upon anode 211 is the hole injecting layer (HIL) 212. The HIL 212 comprises a material which enhances the hole injection efficiency of the anode, such as CuPc.

Deposited upon hole injecting layer 212 is the phosphorescent-doped mixed layer 213 from which light emits. The phosphorescent-doped mixed layer 213 comprises an organic small molecule hole transporting material and an organic small molecule electron transporting material acting as the host materials for a phosphorescent dopant. The organic small molecule hole transporting material, organic small molecule electron transporting material and the phosphorescent dopant are uniformly distributed throughout the mixed layer 213. The organic small molecule hole transporting material may be comprised of material that is known in the art for use in an HTL, and the organic small molecule electron transporting material may be comprised of material that is known in the art for use in an ETL. Also, the dopant in the mixed layer may be comprised of a phosphorescent material that is also known in the art. U.S. Pat. No. 6,097,147 discloses several examples of HTL, ETL, and phosphorescent materials, and its disclosure is herein incorporated by reference. Suitable examples of the organic small molecule hole transporting material, organic small molecule electron transporting material, and phosphorescent material are NPD, $Alq_3$, and PtOEP, respectively.

Although the mixed layer 213 is disclosed in the representative embodiment as having a composition of electron transporting material (ETM), hole transporting material (HTM) and phosphorescent material (PM) that has a weight percent ratio of HTM:ETM:PM that is substantially constant throughout the mixed layer, in an alternative embodiment the weight percent ratio of HTM:ETM:PM may continuously vary from one surface to the opposite surface of the mixed layer. For example, the charge-carrying HTM:ETM weight percent ratio may vary from as much as 100:0 weight percent on one side of the mixed layer down to as little as 0:100 weight percent on the opposite side of the mixed layer. Furthermore, the rate of change in concentration also need not be constant. For example, on the anode side of the mixed layer, the charge-carrying material in the mixed layer may be close to 100% weight percent HTM changing only gradually for the first few nanometers, increasing much more rapidly in the middle of the mixed layer, and then once again changing more slowly on the cathode side of the device, where the charge-carrying material in the mixed layer may contain up to 100% weight percent ETM. The overall ratio of charge carrying materials may vary from about 95:5 weight percent HTM:ETM down to about 5:95 weight percent HTM:ETM. Similarly, the PM that is doped in the mixed layer may also vary from as little as about 0.1% weight percent up to as much as 50% weight percent of the total mixed layer composition, also without necessarily being constant throughout the mixed layer.

Representative materials that may be used in the present invention include those such as disclosed in: M. A. Baldo et al., "Highly efficient phosphorescent emission from organic electroluminescent devices", 395 *Nature* 151–154 (1998); D. F. O'Brien et al., "Improved energy transfer in electrophosphorescent devices," 74:3 *Applied Physics Letters* 442–444 (1999); M. A. Baldo et al., "Very high-efficiency green organic light-emitting devices based on electrophosphorescence," 75:3 *Applied Physics Letters* 4–6 (1999); M. A. Baldo et al., "Excitonic singlet-triplet ratio in a semiconducting organic thin film," 60:20 14 *Physical Review B* 422–428 (1999); C. Adachi et al., "High-efficiency organic phosphorescent devices with tris(2-phenylpyridine doped into electron-transporting materials," 77:6 *Applied Physics Letters* 904–906 (2000); Raymond C. Kwong et al., "Organic Light Emitting Devices Based on Phosphorescent Hosts and Dyes," 2000:11 *Advanced Materials* 1134–1138; Raymond C. Kwong et al., "Efficient, Saturated Red Organic Light Emitting Devices Based on Phosphorescent Platinum (II) Porphyrins," 1999:11 *Chemistry of Materials* 3709–3713; Peter I. Djurovich et al., "Ir(III) cyclometallated complexes as efficient phosphorescent emitters in polymer blend and organic LEDs," 2000:41 (1) *Polymer Preprints* 770.

Deposited upon phosphorescent-doped mixed layer 213 is the ETL 214. As discussed above, materials for use in an ETL are known in the art, and the ETL 214 comprises a material, such as $Alq_3$, which supplies electrons to an emission layer such that recombination with holes can occur. The ETL also leads to improved device efficiency because it inhibits holes from migrating to the cathode, thus keeping them within the phosphorescent-doped mixed layer for recombination with electrons.

Deposited upon the ETL 214 is a cathode 215. The cathode 215 may be comprised of, for example, MgAg, ITO, LiF/Al, Ag or Au.

The deposition techniques for any of the above-listed layers and materials are well-known in the art. For example, a representative method of depositing the OLED layers (i.e., HIL, mixed layer and ETL layers) is by thermal evaporation (or spin coating if a polymer LED is used); a representative method of depositing metal layers is by thermal or electron-beam evaporation; and a representative method of depositing indium tin oxide is by electron-beam evaporation or sputtering.

The present invention may be used to provide stable, efficient, high brightness, monochromatic, multicolor, or full-color, flat panel displays of any size. The images created on such displays could be text or illustrations in full-color, in any resolution depending on the size of the individual OLEDs. Display devices of the present invention are therefore appropriate for an extremely wide variety of applications including billboards and signs, computer monitors, and telecommunications devices such as telephones, televisions, large area wall screens, theater screens and stadium screens. The structures described herein are included, for example, in a plurality of pixels in a light emitting device or as part of a single-pixel device. Moreover, the structures described herein may be used as part of a laser device.

Because of the exceptionally high luminous efficiencies that are possible for phosphorescent-based OLEDs, as compared with OLEDs generally, and especially with respect to conventional inorganic LEDs, the phosphorescent-based OLEDs of the present invention may also be used as a light source for illumination applications. Such light sources could replace conventional incandescent or fluorescent lamps for certain types of illumination applications. Such phosphorescence-based OLEDs could be used, for example, in large planar light sources that produce illumination of a desired color.

The present invention is further described with reference to the following non-limiting examples. Except for the specific combination of materials and structures that fall within the scope of the present invention, the general methods and materials used for fabricating and evaluating the performance of the OLEDs in these examples are known in the art.

EXAMPLE 1

Figure 3:
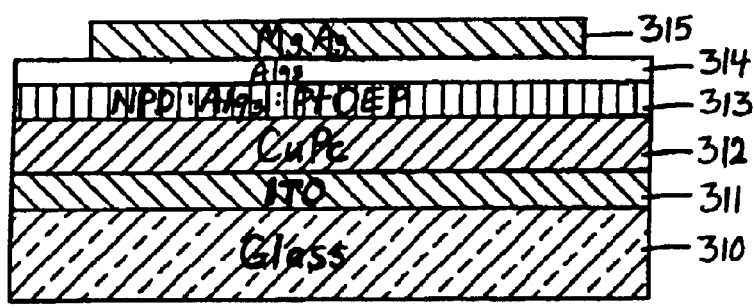
FIG. 3 is a cross sectional view of an exemplary embodiment of the present invention.

A phosphorescent electroluminescent device 300 as shown in FIG. 3 was formed using conventional deposition techniques. The device 300 included the following layers deposited onto a glass substrate 310: an anode 311 comprising indium tin oxide, an HIL 312 comprising CuPc, a phosphorescent-doped mixed layer 313 comprising NPD and $Alq_3$ doped with PtOEP, an ETL 314 comprising $Alq_3$, and a cathode 315 comprising magnesium-silver alloy. On a weight percent basis, the phosphorescent-doped mixed layer 313 is comprised of 46% NPD, 46% $Alq_3$ and 8% PtOEP.

Figure 4:
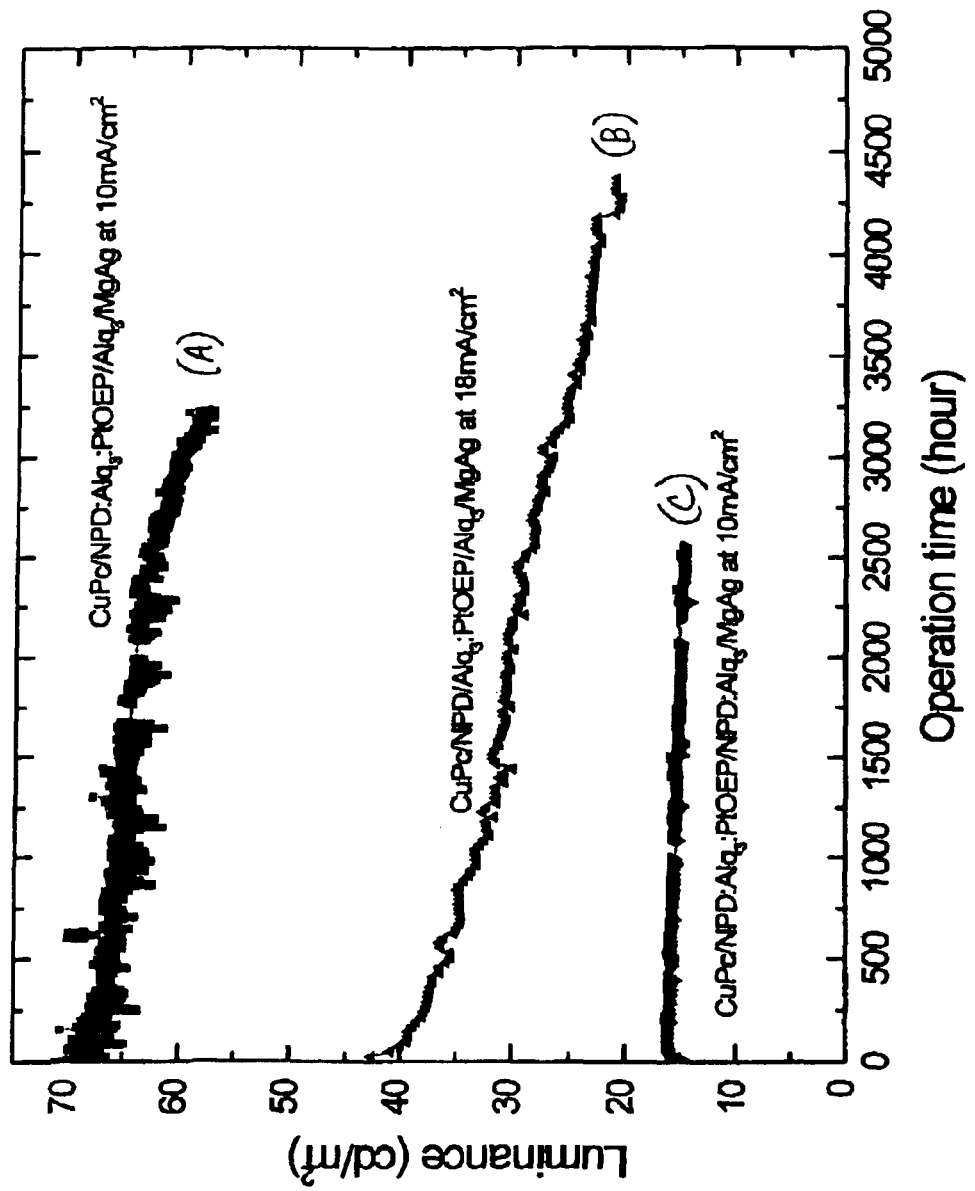
FIG. 4 compares the luminance as a function of time of an OLED with a mixed layer architecture according to an embodiment of the present invention to: (1) an OLED not having a mixed layer architecture; and (2) an OLED having an ETL between the mixed layer and the cathode.

The ETL 314 was included in the device 300 not only to supply electrons to the phosphorescent-doped mixed layer 313, but also to prevent the migration of holes from the phosphorescent-doped mixed layer 313 to the cathode 315, which would detrimentally effect the efficiency of the device. The hole blocking function of the ETL 314 is demonstrated by a comparison of the curves labeled A and C in FIG. 4. Curve A of FIG. 4 plots the luminance as a function of time of an OLED with the phosphorescent-doped mixed layer architecture according to the present invention as depicted in device 300, while curve C of FIG. 4 plots the luminance as a function of time of an OLED with an HTL:ETL layer in place of the ETL, but otherwise identical to the device 300. The luminance produced by the device represented by curve C ranged from only approximately 17–15 cd/m$^2$ over the course of 2500 hours. In contrast, the luminance was much greater, at the same current density of 10 mA/cm$^2$, ranging from approximately 68–63 cd/m$^2$ over that same time period (curve A), when produced by the device 300. This difference is believed to be due to the ETL 314, which prevented hole migration to the cathode 315, thereby substantially keeping holes within the phosphorescent-doped mixed layer 313 for recombination with electrons.

The phosphorescent-doped mixed layer 313 is believed to contribute to the high stability and efficiency of the OLED with a phosphorescent-doped mixed layer architecture according to the present invention. The phosphorescent-doped mixed layer 313, because it is a continuous organic composition without HTL/ETL heterojunction interfaces therein, serves to substantially reduce the accumulation of charges normally present at the heterojunction interface of a heterojunction device, thus reducing organic material decomposition and enhancing device stability and efficiency. As shown in FIG. 4, curve B plots the luminance as a function of time for a typical heterojunction device, which does not include the phosphorescent-doped mixed layer of the present invention. In comparing these curves representing the mixed-layer device 300 of the present invention, the initial luminance produced by the mixed-layer device 300 is about three times greater than that of the non-mixed-layer devices (after normalized to the same current of 18 mA/cm$^2$). Furthermore, after 3000 hours of operation, because of the outstanding efficiency and stability, the lifetime luminance as expressed in nit-hours (luminance× operating time) that was produced by the mixed-layer device 300 was 210,000 nit-hours (constant current at 10 mA/cm$^2$) as compared with the non-mixed-layer devices that produced a lifetime luminance of about 105,000 nit-hours. Thus, not only was the lifetime luminance of the mixed-layer devices about twice as high as the non-mixed-layer devices, these higher results were advantageously produced at about half the current density.

EXAMPLE 2

A phosphorescent electroluminescent device was also formed using deposition techniques known in the art except for the specific combination of layers that fall within the scope of the present invention. In particular, the device included the following layers deposited onto a glass substrate: an anode comprising indium tin oxide, an HIL comprising CuPc, an HTL comprising NPD, a phosphorescent-doped mixed layer comprising NPD and Alq$_3$ doped with BTPIr, an ETL comprising Alq$_3$, and a cathode comprising an LiF layer and an aluminum layer.

Figure 5:
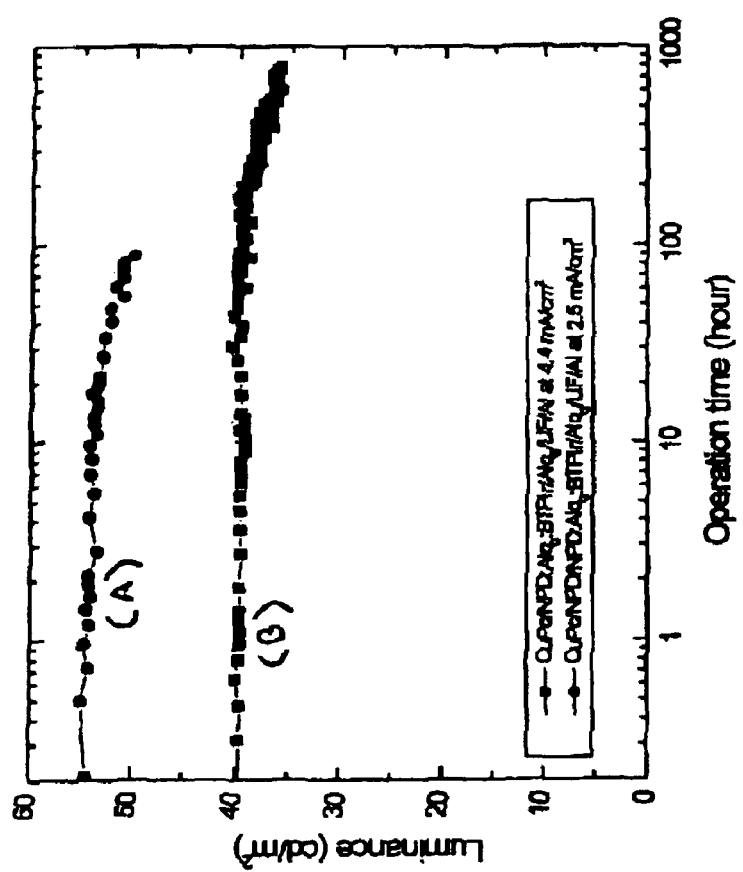
FIG. 5 compares the luminance as a function of time of an OLED with a mixed layer architecture to an alternate embodiment of the invention including an HTL between the mixed layer and the anode, and an ETL between the mixed layer and the cathode.

The HTL is selected such that it not only transports holes but also confines excitons in the emissive layer. The exciton confinement function of this NPD layer is demonstrated by a comparison of the curves labeled A and B in FIG. 5. Curve A of FIG. 5 plots the luminance as a function of time of an OLED with the phosphorescent-doped mixed layer architecture as set forth in Example 2, while curve B of FIG. 5 plots the luminance as a function of time of an OLED without the additional NPD layer. The additional NPD layer functions as a exciton blocking layer which retards BTPIr excitons from reaching the CuPc layer where exciton quenching may occur. LiF functions as an electron injection material when present in combination with the Al layer. Whereas the luminance produced by the device represented by curve A ranged from approximately 54–52 cd/m$^2$ at 2.5 mA/m$^2$ over the course of 100 hours, the luminance produced by the device represented by curve B ranged from approximately 41–38 cd/m$^2$ at 4.4 mA/cm$^2$ over the course of about 1000 hours. The initial efficiencies were 2 cd/A and 0.9 cd/A respectively. This is believed to be an effect of the additional NPD layer as described above. Although the stability of B may be slightly better within the 100-hour range of operation, the stability of A is still satisfactory.

The present invention provides highly stable and efficient electroluminescent devices, particularly for phosphorescent emission. Those with skill in the art may recognize various modifications to the embodiments of the invention described and illustrated herein. Such modifications are meant to be covered by the spirit and scope of the appended claims.

We claim:

1. An organic light emitting device comprising:
   a substrate;
   an anode layer over the substrate;
   a hole injecting layer over the anode layer;
   a mixed layer over the hole injecting layer, the mixed layer functioning as an emission layer and comprising an organic small molecule hole transporting material, an organic small molecule electron transporting material and a phosphorescent dopant; and
   a cathode layer over the mixed layer.

2. The device of claim 1, further comprising an electron transporting layer between the mixed layer and the cathode layer.

3. The device of claim 1, wherein the anode layer comprises indium tin oxide.

4. The device of claim 1, wherein the hole injecting layer comprises CuPc.

5. The device of claim 1, wherein the organic small molecule hole transporting material comprises NPD, the organic small molecule electron transporting material comprises Alq$_3$, and the phosphorescent dopant comprises PtOEP.

6. The device of claim 1, wherein the organic small molecule hole transporting material comprises NPD, the organic small molecule electron transporting material comprises Alq$_3$, and the phosphorescent dopant comprises BTPIr.

7. The device of claim 2, wherein the electron transporting layer comprises Alq$_3$.

8. The device of claim 1, wherein the cathode comprises magnesium-silver alloy.

9. The device of claim 1, wherein the cathode comprises LiF/Al.

10. The device of claim 1, wherein the substrate is transparent.

11. The device of claim 10, wherein the cathode layer is transparent.

12. The device of claim 10, wherein the substrate comprises plastic.

13. The device of claim 10, wherein the substrate comprises a flexible plastic.

14. The device of claim 1, wherein the substrate is substantially opaque and the cathode layer is transparent.

15. The device of claim 10, wherein the substrate comprises glass.

16. An electronic device incorporating the device of claim 1, the electronic device selected from the group consisting of a computer; a television; a large area wall, theater or stadium screen; a billboard; a sign; a vehicle; a printer; a telecommunication device; a telephone; and a light source.

17. An organic light emitting device comprising:
   a substrate;
   a substantially transparent anode layer comprising indium tin oxide;
   a hole injecting layer over the anode layer, the hole injecting layer comprising CuPc;
   a mixed layer over the hole injecting layer, the mixed layer functioning as an emission layer and comprising an organic small molecule hole transporting material, an organic small molecule electron transporting material and a phosphorescent dopant, the organic small molecule hole transporting material comprising NPD, the organic small molecule electron transporting material comprising $Alq_3$, and the phosphorescent dopant comprising PtOEP;
   an electron transporting layer over the mixed layer, the electron transporting layer comprising $Alq_3$; and
   a cathode layer over the electron transporting layer, the cathode layer comprising magnesium-silver alloy.

18. The device of claim 17, wherein the substrate is transparent.

19. The device of claim 17, wherein the substrate comprises glass.

20. The device of claim 17, wherein the substrate comprises plastic.

21. The device of claim 17, wherein the substrate comprises a flexible plastic.

22. A multicolor display device comprising a plurality of pixels, wherein at least one of said pixels comprises:
   a substrate;
   a substantially transparent anode layer over the substrate;
   a hole injecting layer over the anode layer;
   a mixed layer over the hole injecting layer, the mixed layer functioning as an emission layer and comprising an organic small molecule hole transporting material, an organic small molecule electron transporting material and a phosphorescent dopant;
   an electron transporting layer over the mixed layer; and
   a cathode layer over the electron transporting layer.

23. An electronic device incorporating the device of claim 22, the electronic device selected from the group consisting of a computer; a television; a large area wall, theater or stadium screen; a billboard; a sign; a vehicle; a printer; a telecommmunication device; a telephone; and a light source.

24. The device of claim 2, further including an electron injection material between the electron transporting layer and the cathode.

25. The device of claim 24, further including an exciton blocking layer between the hole injecting layer and the mixed layer.

26. The device of claim 25, wherein the exciton blocking layer is NPD.

27. The device of claim 24, wherein the electron injection material is LiF.

28. The device of claim 24, wherein the organic small molecule hole transporting material comprises NPD, the organic small molecule electron transporting material comprises $Alq_3$, and the phosphorescent dopant comprises BTPIr.

29. The device of claim 24, wherein the organic small molecule hole transporting material comprises NPD, the organic small molecule electron transporting material comprises $Alq_3$, and the phosphorescent dopant comprises PtOEP.

30. The device of claim 24, wherein the cathode layer comprises Al.

31. The device of claim 1, wherein the organic small molecule hole transporting material comprises NPD.

* * * * *